United States Patent [19]

Arabi et al.

[11] Patent Number: 6,005,407
[45] Date of Patent: Dec. 21, 1999

[54] OSCILLATION-BASED TEST METHOD FOR TESTING AN AT LEAST PARTIALLY ANALOG CIRCUIT

[75] Inventors: Karim Arabi; Bozena Kaminska, both of Montréal, Canada

[73] Assignee: Opmax Inc., Montreal, Canada

[21] Appl. No.: 08/546,806

[22] Filed: Oct. 23, 1995

[51] Int. Cl.[6] ............................. G01R 31/28; G01R 31/22
[52] U.S. Cl. ......................... 324/765; 324/763; 324/73.1
[58] Field of Search ............................... 324/73.1, 158.1, 324/763, 765; 371/22.1, 22.3, 22.6, 15.1, 25.1, 22.5; 438/14, 17; 257/40, 48

[56] References Cited

U.S. PATENT DOCUMENTS

| | | | |
|---|---|---|---|
| 3,389,336 | 6/1968 | Hilsenrath et al. | 324/158 |
| 3,825,828 | 7/1974 | Pfeiffer | 324/765 |
| 4,135,153 | 1/1979 | Stone | 324/765 |
| 4,357,703 | 11/1982 | Van Brunt | 371/15 |
| 4,513,418 | 4/1985 | Bardell et al. | 371/25 |
| 4,701,920 | 10/1987 | Resnick et al. | 371/22.5 |
| 4,749,947 | 6/1988 | Gheewala | 324/73 R |
| 4,833,395 | 5/1989 | Sasaki et al. | 324/73 R |
| 5,039,602 | 8/1991 | Merrill et al. | 437/8 |
| 5,065,091 | 11/1991 | Tobita | 324/158 R |
| 5,095,267 | 3/1992 | Merrill et al. | 371/22.5 |
| 5,099,196 | 3/1992 | Longwell et al. | 324/73.1 |
| 5,107,208 | 4/1992 | Lee | 324/158 R |
| 5,150,044 | 9/1992 | Hashizume et al. | 324/158 R |
| 5,254,940 | 10/1993 | Oke et al. | 324/158 R |
| 5,260,949 | 11/1993 | Hashizume et al. | 371/22.3 |
| 5,341,096 | 8/1994 | Yamamura | 324/765 |
| 5,363,381 | 11/1994 | Hasegawa | 371/22.1 |
| 5,381,087 | 1/1995 | Hirano | 324/158.1 |
| 5,428,626 | 6/1995 | Frisch et al. | 324/158.1 |
| 5,477,139 | 12/1995 | Wert et al. | 324/158.1 |
| 5,477,545 | 12/1995 | Huang | 324/158.1 |
| 5,625,288 | 4/1997 | Snyder et al. | 324/763 |
| 5,729,151 | 3/1998 | Zoerner et al. | 324/765 |

FOREIGN PATENT DOCUMENTS 4 007 187  9/1990  Germany .

OTHER PUBLICATIONS

"Built–In Self–Test Structure for Analog Circuit Fault Diagnosis", C.L. Wey, IEEE Transactions on Instrumentation and Measurement, 39(3), 1990, pp. 517–521 (no month available).

"Optimal Test Set Design for Analog Circuits" L. Milor et al., IEEE ICCAD, 1990, pp. 294–297 (no month available).

"Design for Testability for Mixed Analog/Digital ASICS", P.P. Fasang, D. Mulins and T. Wong, IEEE Custom Integrated Circuit Conf., 1988, pp. 16.5.1–16.5.4 (no month available).

"Design for Testability of Mixed Signal Integrated Circuits" K.D. Wagner, T.W. Williams, IEEE Int. Test Conf., 1988, pp. 823–829. (no month available).

"DC IATP—An Iterative Analog Circuit Test Generation Program for Generating Single Pattern Tests" M.J. Marlett and J.A. Abraham, IEEE Int. Test Conf. 1988, pp. 839–844 (no month available).

(List continued on next page.)

*Primary Examiner*—Vinh P. Nguyen
*Attorney, Agent, or Firm*—Goudreau Gage Dubuc & Martineau Walker

[57] ABSTRACT

The oscillation-based test method and device is applied to at least partially analog circuits. The at least partially analog circuit is first divided into building blocks each having a given structure. Each building block is then inserted into an oscillator circuit to produce an output signal having an oscillation frequency related to the structure of the building block under test. The oscillation frequency is then measured and a fault in the building block under test is detected when the measured oscillation frequency deviates from a given, nominal frequency. Experiments have demonstrated that the frequency deviation enables the detection of catastrophic and/or parametric faults, and ensures a high fault coverage. In this new time-domain test method, a single output frequency is evaluated for each building block whereby the test duration is very short. These characteristics make the test strategy very attractive for wafer-probe testing as well as final production testing.

17 Claims, 4 Drawing Sheets

OTHER PUBLICATIONS

"Analytical Fault Modeling and State Test Generation for Analog ICs", G. Devarayanadurg and M. Soma, IEEE ICCAD, 1994, pp. 44–47. (no month available).

"Fault Detection and Input Stimulus Determination for the Testing of Analog Integrated Circuits Based on Power–Supply Current Monitoring" G. Gielen, Z. Wang. and W.Sansen, IEEE ICCAD, 1994, pp. 495–498 (no month available).

"Test Generation for Current Testing" P.Nigh and W.Maly, IEEE Design and Test of Computers, vol. 7, No. 2, 1990, pp.26–38. (no month available).

"Simple Sinusoidal Oscillator Using Opamp Compensation Poles", R. Senani, Electronic Letters, vol. 29, No. 5, 1993, pp. 452–453 (no month available).

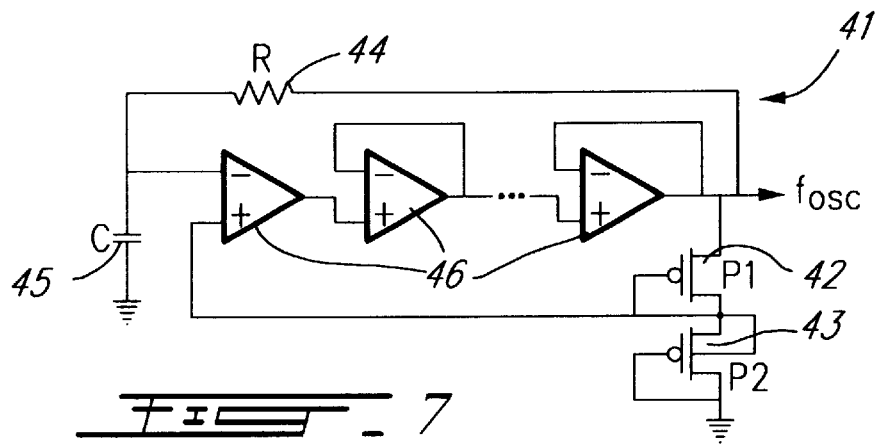
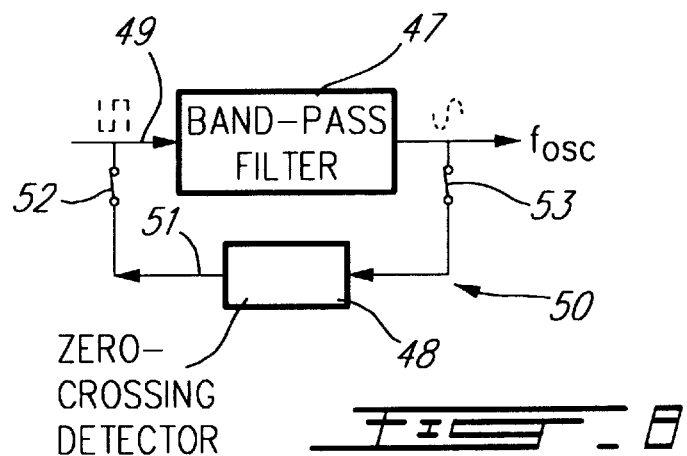
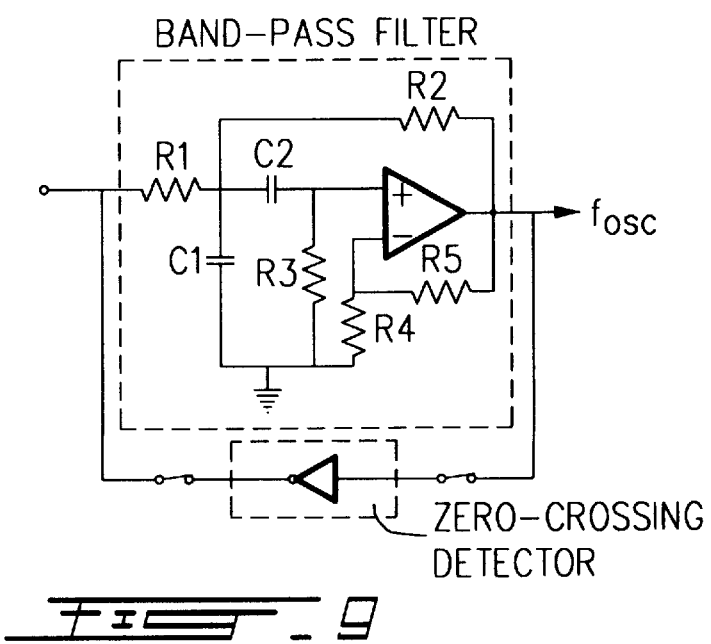

OSCILLATION-BASED TEST METHOD FOR TESTING AN AT LEAST PARTIALLY ANALOG CIRCUIT

BACKGROUND OF THE INVENTION

1. Field of the invention:

The present invention relates to a method and device for testing analog and mixed-signal circuits.

In the present disclosure and in the appended claims, the term "mixed signal circuit" is intended to designate a circuit including both analog and digital circuitry.

2. Brief description of the prior art:

Due to the development of integrating technologies and the market requirements, the trend of designing mixed-signal ASICs (Application-Specific Integrated Circuits) has significantly increased. Analog testing is a challenging task and is considered as one of the most important problems in analog and mixed-signal ASIC design. The specifications of analog circuits are usually very large which results in long testing time and poor fault coverage. A dedicated test equipment is also required. Furthermore, it is very difficult to establish universal fault models equivalent to the so called stuck-at models in digital circuits.

A fault can be either catastrophic or parametric. Catastrophic faults result in complete absence of the desired function. On the other hand, parametric faults result in functional circuit but with degraded performance. Catastrophic faults are easier to test, but when the complexity of the CUT (Circuit Under Test) increases they cause many problems. Parametric faults are the most important and hard to test faults. It should be pointed out that most of the existing test methods address only the catastrophic faults.

Known methods for testing analog blocks comprise functional (or parametric) testing, DC (Direct Current) testing, and power supply current ($I_{DDQ}$) monitoring. Functional (or parametric) testing has been described in the following four articles:

[1] C.-L Wey, "Built-In Self-Test Structure for Analog Circuit Fault Diagnosis", *IEEE Transactions on Instrumentation and Measurement*, 39(3), 1990, pp. 517–521.

[2] L. Milor et al., "Optimal Test Set Design for Analog Circuits", *IEEE ICCAD*, 1990, pp. 294–297.

[3] P. P. Fasang, D. Mulins and T. Wong, "Design for Testability for Mixed Analog/Digital ASICs", *IEEE Custom Integrated Circuit Conf.*, 1988, pp. 16.5.1–16.5.4.

[4] K. D. Wagner and T. W. Williams, "Design for Testability of Mixed signal Integrated Circuits", *IEEE Int. Test Conf.*, 1988, pp. 823–829.

DC testing has been suggested in the following two articles:

[5] M. J. Marlett and J. A. Abraham, "DC IATP-An Iterative Analog Circuit Test Generation Program for Generating Single Pattern Tests", *IEEE Int. Test Conf.*, 1988, pp. 839–844.

[6] G. Devarayanadurg and M. Soma, "Analytical Fault Modelling and Static Test Generation for Analog ICs", *IEEE ICCAD*, 1994, pp. 44–47.

Power-supply current ($I_{DDQ}$) monitoring is discussed in the following two publications:

[7] G. Gielen, Z. Wang and W. Sansen, "Fault Detection and Input Stimulus Determination for the Testing of Analog Integrated Circuits Based on Power-Supply Current Monitoring", *IEEE ICCAD*, 1994, pp. 495–498.

[8] P. Nigh and W. Maly, "Test Generation for Current Testing", IEEE Design & Test of Computers, Vol. 7, No. 2, 1990, pp. 26–38.

Various designs for testability (DFT) rules have been used in conjunction with the above mentioned test methods to ease the test problem (articles [3] and [4]). These techniques are employed during the design stage to increase the controllability and observability and to facilitate the test task. Some of these techniques for digital testing have been the subject of U.S. Pat. No. 4,513,418 (P. H. Bardell et al.) issued on Apr. 23, 1985 for an invention entitled "Simultaneous Self Testing System" and U.S. Pat. No. 4,749,947 granted to T. R. Gheewala on Jun. 7, 1988 for an invention entitled "Cross-Check Test Structure for Testing Integrated Circuits".

The effectiveness of the above methods depends strongly on the selection of suitable test vectors. Also, they need a large number of test vectors to validly testing the functionality of the CUT. When the complexity of the CUT increases, the problem of determining optimal test vectors becomes critical. Furthermore, the process of choosing a suitable form of excitation signals and evaluation of the results is time consuming. BIST (Built-In Self-Test) strategies based of above methods require the use of specialized input stimuli generation and output evaluation hardware which introduce significant area overhead.

OBJECTS OF THE INVENTION

An object of the present invention is therefore to overcome the above discussed drawbacks of the prior art.

Another object of the present invention is to overcome the above discussed drawbacks of the prior art by providing a very efficient method and device for testing analog and mixed-signal circuits, in which the CUT is rearranged into a circuit easier to test.

A further object of the present invention is to provide a method and device for testing analog and mixed-signal circuits, in which the CUT is inserted into an oscillation circuit.

SUMMARY OF THE INVENTION

More particularly, in accordance with the present invention, there is provided an oscillation-based test method for testing an at least partially analog circuit, comprising the steps of:

dividing the at least partially analog circuit into building blocks each having a given structure;

inserting each building block under test into an oscillator circuit to produce an output signal having an oscillation frequency related to the structure of the building block under test;

measuring the oscillation frequency of the output signal; and detecting a fault in the building block under test when the measured oscillation frequency deviates from a given, nominal frequency.

By inserting the building block under test into an oscillator circuit producing an output signal having an oscillation frequency related to the structure of the building block, a catastrophic or parametric fault in the building block can be easily detected by simply sensing a deviation of the measured oscillation frequency from the above mentioned given, nominal frequency.

In accordance with preferred embodiments of the oscillation-based test method of the invention:

the measuring step comprises converting the oscillation frequency of the output signal into a frequency representative number, and the fault detecting step comprises (a) comparing the frequency representative number to a given, nominal number, and (c) detecting a fault in the building block under test when the frequency representative number deviates from the given, nominal number; and the inserting step comprises combining at least two building blocks to form the oscillator circuit.

The present invention is also concerned with a device for testing an at least partially analog circuit divided into building blocks each having a given structure and inserted into an oscillator circuit to produce an output signal having an oscillation frequency related to the structure of the building block, comprising:

means for measuring the oscillation frequency of the output signal; and means for detecting a fault in the building block under test when the measured oscillation frequency deviates from a given, nominal frequency.

In accordance with preferred embodiments of the device according to the invention:

the measuring means comprises a frequency-to-number converter for converting the oscillation frequency of the output signal into a frequency representative number, and the fault detecting means comprises a control logic for comparing the frequency representative number to a given, nominal number and for detecting a fault in the building block under test when the frequency representative number deviates from the given, nominal number;

the frequency-to-number converter comprises a zero crossing detector for detecting passages of the output signal by a zero amplitude to produce a square wave clock signal including a series of pulses, and a counter for counting the pulses of the square wave clock signal to produce the frequency representative number;

the test device further comprises an additional circuitry, and means for connecting the additional circuitry to the building block under test to form an oscillator circuit, wherein these connecting means comprises means for successively connecting the additional circuitry to different building blocks in order to test the different buildings blocks with the same additional circuitry.

The objects, advantages and other features of the present invention will become more apparent upon reading of the following non restrictive description of preferred embodiments thereof, given by way of example only with reference to the accompanying drawings.

BRIEF DESCRIPTION OF THE DRAWINGS

In the appended drawings:

FIG. 7 is a schematic block diagram showing a DFT technique for inserting a chain of operational amplifiers (CUT) into an oscillator circuit;

FIG. 8 is a schematic block diagram showing a DFT technique for inserting a high-Q band-pass filter into an oscillator circuit by means of a positive feedback loop including a zero-crossing detector;

FIG. 9 is a diagram showing the implementation of the method of FIG. 8 to a second order active band-pass filter;

DETAILED DESCRIPTION OF THE PREFERRED EMBODIMENTS

The following description will show how the oscillation-based testing method in accordance with the present invention can be applied to common integrated analog or mixed-signals circuits such as embedded operational amplifiers, filters, and analog-to-digital converters. However, it should be kept in mind that the method and device in accordance with the present invention can be easily applied to other types of circuits such as functional analog circuits and non integrated circuits.

Figure 1:
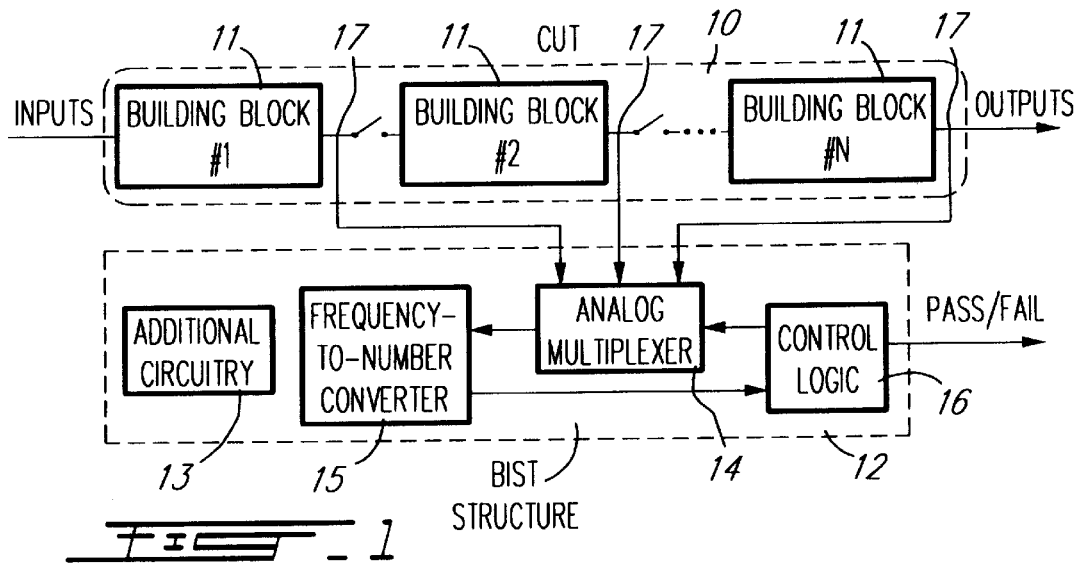
FIG. 1 is a schematic block diagram illustrating an oscillation-based built-in self test (OBIST) embodying the test method of the present invention, for analog and mixed-signal circuits.

More specifically, FIG. 1 illustrates a basic BIST structure suitable for use in the oscillation-based testing method according to the invention.

Referring to FIG. 1, the method first comprises the step of dividing the CUT 10 into building blocks such as 11. The CUT is then in the test mode.

The BIST structure 12 comprises some additional circuitry 13 integrated to the CUT 10 and to be connected to each building block 11 to form with this building block 11 an oscillator circuit producing an output signal having an oscillation frequency related to the structure of the building block 11 under test. Examples of additional circuitry 13 suitable to form with the building blocks 11 oscillator circuits will be described in the following description.

The BIST structure 12 of FIG. 1 further comprises an analog multiplexer 14, a frequency-to-number converter 15, and a control logic 16. The analog multiplexer 14 is connected to the different outputs 17 of the building blocks 11 to successively select these outputs 17 under the control of the control logic 16. The oscillation frequency of the signal at the output 17 of the building block 11 being selected by the analog multiplexer 14 is converted to a frequency representative number by the frequency-to-number converter 15. The control logic 16 then compares the frequency representative number from the frequency-to-number converter 15 to a given, nominal number corresponding a nominal frequency of oscillation of the so formed oscillator circuit, and detects a fault in the building block 11 under test when the frequency representative number deviates the given, nominal number. When the frequency representative number corresponds to the given, nominal number, the control logic 16 delivers a "pass" signal indicating that the building block 11 under test is fully functional. On the contrary, when the frequency representative number from the converter 15 deviates from the given, nominal number, the control logic 16 delivers a "fail" signal indicating that the building block 11 of the CUT 10 is faulty.

To verify the functionality of the BIST structure 12 itself, the circuitry of the BIST structure 12 is tested during a self-test phase before testing the CUT 10.

Figure 2:
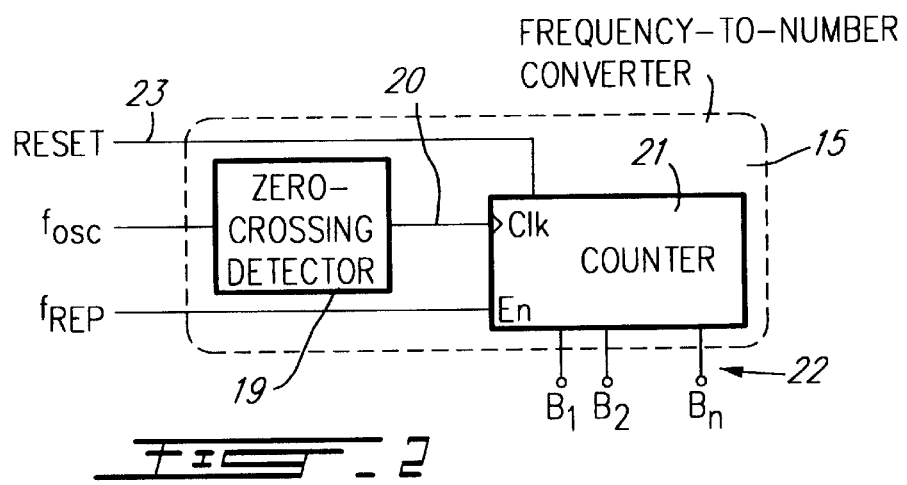
FIG. 2 is a schematic block diagram of a frequency-to-number converter used in the oscillation-based test method of FIG. 1.

FIG. 2 is a schematic block diagram of the frequency-to-number converter 15 of FIG. 1.

The frequency-to-number converter 15 can be implemented using various techniques such as a phase-locked loop (PLL) or any type of FM (Frequency Modulation) demodulator. The preferred embodiment of FIG. 2 uses a simple and fully digital circuit capable of converting each frequency to a related number. The oscillation frequency $f_{OSC}$ of the selected output 17 is supplied by the analog multiplexer 14 to a zero crossing detector 19. The zero crossing detector 19 detects passages of the oscillation output signal by a zero amplitude to produce on its output 20 a square wave clock signal including a series of pulses and applied to a counter 21. The counter 21 is enabled by the high signal level of a square wave reference frequency $f_{REF}$. Therefore, during the high signal level of the square wave reference frequency $f_{REF}$, the counter 21 counts the pulses from the output 20 while during its low signal level the counter 21 is disabled and stops counting. The counter 21 delivers an output digital count value on a parallel output 22. The output count value from the parallel output 22 of the counter 21 is representative of a number related to the input frequency $f_{OSC}$ coming from the output 17 of a building block 11 under test, and can be evaluated by the control logic 16. After evaluation of the output frequency representative number from the counter 21, the control logic 16 resets the counter 21 through the input 23 thereof. Those of ordinary skill in the art will appreciate that an accurate frequency-to-number conversion is obtained; the accuracy of the frequency-to-number converter 15 is determined by the reference frequency $f_{REF}$ signal and the number of bits of the parallel output 22 of the counter 21. More specifically, the digital output of the counter 21 is given by the following relation:

$$B_{1:n} \cong \frac{(f_{OSC}/f_{REF})}{2}$$

In fact, the oscillation frequency $f_{OSC}$ is divided by the reference frequency $f_{REF}$ to obtain the number $B_{1:n}$. This technique produces a very good accuracy and satisfies the requirement of the intended application.

Figure 3:
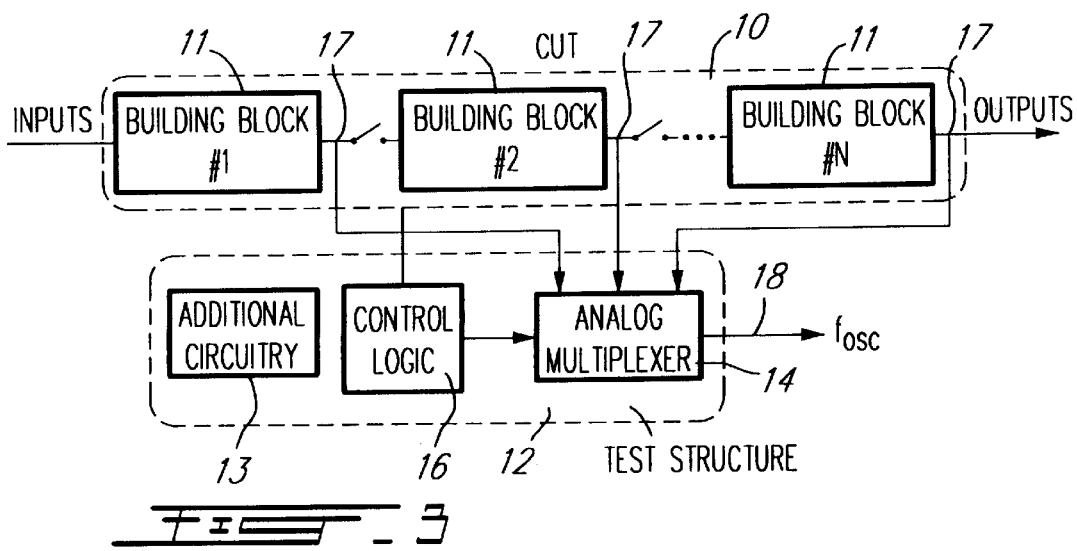
FIG. 3 is a schematic block diagram illustrating an embodiment of the oscillation-based test method in accordance with the present invention, to improve the testability of analog and mixed-signal circuits.

In the example of FIG. 3, the oscillation-based test method is used to facilitate the test problem. The test structure 12 then comprises the additional circuitry 13, the analog multiplexer 14 and the control logic 16.

Again, the additional circuitry 13 is to be connected to each building block 11 to form with this building block 11 an oscillator circuit producing an output signal having an oscillation frequency related to the structure of the building block 11 under test. The analog multiplexer 14 is connected to the different outputs 17 of the building blocks 11 to successively select these outputs 17 under the control of the logic 16. The oscillation frequency $f_{OSC}$ at the output 17 of the building block 11 being selected by the analog multiplexer 14 is then supplied to an output 18 of the test structure 12. The oscillation frequency $f_{OSC}$ from the output 18 of the BIST structure 12 is evaluated externally using a test equipment (not shown). The embodiment of FIG. 3 enables an important simplification of the control logic 16 and more generally of the test structure 12. In this case, since the oscillation frequency is externally evaluated, the voltage level of the oscillation frequency signal from the output 17 of the building block 11 being tested can also be evaluated to improve the fault coverage.

For each type of building block 11, various techniques can be easily found to insert the building block into an oscillator circuit. A mathematical approach is to convert the transfer function of the CUT to the transfer function of an oscillator, and then to modify the internal circuitry of the CUT to obtain the new transfer function. For example, second order active filters can be converted to oscillators by making the quality factor $Q_F$ infinite, which means that the poles are on the jω axis. A more general technique consists of performing some mathematical operations to obtain the oscillator's transfer function.

Figures 4A, 4B:
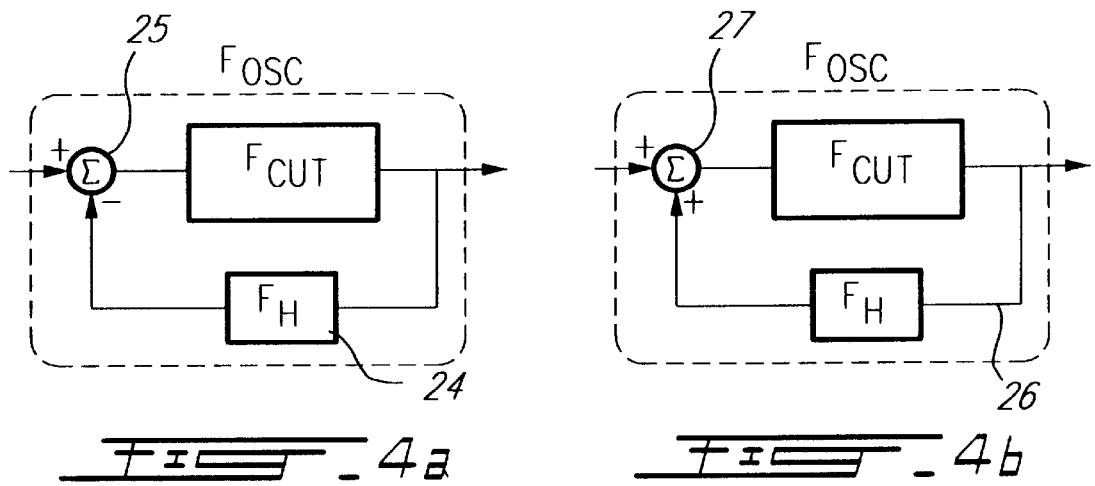
FIG. 4a is a schematic block diagram illustrating a first mathematical approach for inserting a CUT into an oscillator circuit using a negative feedback loop.
FIG. 4b is a schematic block diagram illustrating a second mathematical approach for inserting a CUT into an oscillator circuit using a positive feedback loop.

In the example of FIG. 4a, a negative feedback loop 24 including a transfer function $F_H$ and and adder 25 is added to the transfer function $F_{CUT}$ g of the building block 11 to achieve the transfer function $F_{OSC}$ of an oscillator. The transfer functional $F_{OSC}$ of FIG. 4a can then be expressed as follows:

$$F_{OSC} = \frac{F_{CUT}}{(1 + F_{CUT} F_H)}$$

Thus $F_H$ is given by the following relation:

$$F_H = \frac{(F_{CUT} - F_{OSC})}{(F_{CUT} F_{OSC})}$$

Another approach is illustrated in FIG. 4b. The approach of FIG. 4b consists of adding to the transfer function Fcr of the building block 11 a positive feedback loop 26 including a transfer function $F_H$ and an adder 27, and of trying to satisfy the condition of oscillation by appropriately selecting the parameters of the transfer function $F_H$. In that case, the new transfer function is given by the following relation:

$$F_{OSC} = \frac{F_{CUT}}{(1 - F_{CUT} F_H)}$$

and the condition for the feedback loop to cause sinusoidal oscillations of frequency $\omega_o$ is that:

$$|F_{CUT}(j\omega_o)||F_H(j\omega_o)| \geq 1$$

and the phase of the signal φ around the loop is such that:

$$\phi_A + \phi_B = 0°$$

where $\phi_A$ and $\phi_B$ are the phase shifts associated with the CUT and feedback network, respectively.

It is further possible to add both positive and negative feedback loops and then to force the resulting circuit to oscillate.

A further possible solution is to employ heuristic circuit techniques to obtain an oscillator from the original building block 11 of the CUT.

Some examples of application of the oscillation-based test method in accordance with the present invention will now be described. These examples are given for the purpose of exemplification only and should not be interpreted as limiting the scope of the invention.

FIG. 5

The operational amplifiers are the blocks most frequently encountered in analog and mixed-signal circuits. For analog functional blocks with embedded operational amplifiers, the test procedure will be easier and the fault coverage will be higher if it can be assumed that the operational amplifiers are not faulty. Therefore, the interest of developing an efficient technique to test operational amplifiers is obvious.

Figure 5:
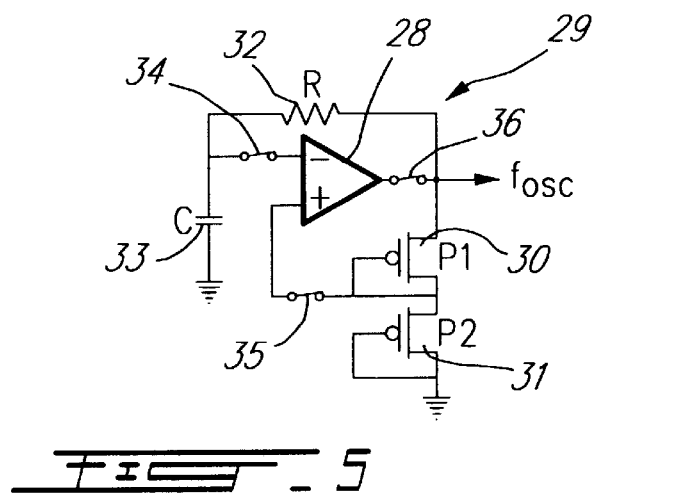
FIG. 5 is a schematic block diagram showing a DFT technique for inserting an operational amplifier (CUT) into an oscillator circuit in which the oscillation frequency is related to the internal structure of the operational amplifier.

In FIG. 5, an operational amplifier 28 is tested. To perform the test, the operational amplifier 28 is inserted into a simple operational-amplifier-based oscillator circuit 29. In this particular case, the additional circuitry 13 comprises two transistors 30 and 31, a resistor 32 and a capacitor 33, forming part of the integrated circuit and connectable as shown in FIG. 5 to the operational amplifier 28 through switching elements 34–36 for the duration of the test. After the test, the switching elements are opened to disconnect the operational amplifier 28 from the additional circuitry 13. The switching elements 34–36 are semiconductor elements such as transistors or the like which, in the closed state of the switching elements 34–36 have a low resistance to minimize performance degradation. The area overhead due to these switching elements 34–36 on the integrated circuit (CUT) being tested is very, very small.

The oscillation frequency of the circuit of FIG. 5 depends on the value of the internal dominant pole and the DC open loop gain of the operational amplifier 28, the resistance R of the resistor 32, and the capacitance C of the capacitor 33. The transistors 30 and 31 are used as active resistors to introduce a positive feedback and are adjusted to guarantee a sustained oscillation.

The additional circuitry 13 is used for all the operational amplifiers of the chip (CUT 10) whereby the area overhead is very small. The operational amplifiers are successively connected to, that is inserted in the oscillator circuitry of FIG. 5 through the above mentioned switching elements and, as described in the foregoing description, the oscillation frequency is evaluated to determine whether the operational amplifier is faulty or not.

Simulations have shown that the majority of catastrophic faults result in a loss of oscillation.

FIG. 6

Figure 6:
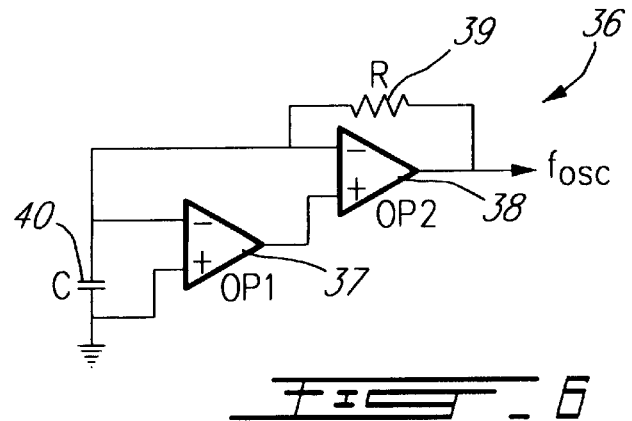
FIG. 6 is a schematic block diagram showing a DFT technique for inserting two operational amplifiers (CUT) into an oscillator circuit whose oscillation frequency depends on the internal structure of the two operational amplifiers under test.

Another oscillator circuit 36 suitable for simultaneously testing two operational amplifiers 37 and 38 is illustrated in FIG. 6 and has been described in the article of R. Senani entitled "Simple Sinusoidal Oscillator Using Opamp Compensation Poles", published in *Electronic Letters*, Vol. 29, No. 5, 1993, pp. 452–453. The oscillator circuit 36 of FIG. 6 is a simple sinusoidal oscillator using the compensation poles of the operational amplifiers 37 and 38 and, therefore, the oscillation frequency is tightly related to the internal structure of these operational amplifiers 37 and 38. The additional circuitry 13 simply comprises a resistor 39 and a capacitor 40 whereby the area overhead on the integrated circuit is smaller than in the previous circuit illustrated in FIG. 5. The connections between the operational amplifiers 37 and 38, the resistor 39 and the capacitor 40 are clearly shown in FIG. 6 and can be established through switching elements (not shown) as described with reference to FIG. 5 for the duration of the test. The condition of oscillation and the frequency of oscillation $f_{OSC}$ are $$\left(\omega_{t1} - \frac{1}{\tau}\right) \leq 0$$

and $$f_{OSC} = \sqrt{(f_{t1}f_{t2})}$$

respectively, where $\omega_{t1}$ is the GBW (unity-gain bandwidth) of the first operational amplifier 37, $\tau$=RC and $f_{ti}=\omega_{ti}/2\Pi$.

Experiments with the oscillators of FIGS. 5 and 6 have proved that both catastrophic and parametric faults manifest as a deviation of the oscillation frequency from the given, nominal frequency and, therefore, can be easily detected.

FIG. 7

An approach to speed up the test process is to place all the operational amplifiers 46 of a given CUT into a chain to construct an oscillator circuit 41 as illustrated in FIG. 7. The additional circuitry 13 then simply comprises two transistors 42 and 43, a resistor 44, and a capacitor 45 interconnected with the chain of operational amplifiers 46 as illustrated in FIG. 7. With the circuit of FIG. 7, the test time is significantly reduced but the fault coverage will be smaller. However, a hard fault in any of the operational amplifiers 46 deviates the oscillation frequency from its nominal value and, therefore, is detectable.

FIG. 8

In this example, a high-Q band-pass filter 47 is converted to an oscillator using a quite simple technique. The basic principle of the example of FIG. 8 is to place the band-pass filter 47 in a positive-feedback loop 50 including a zero-crossing detector 48 or a hard limiter. The wide band noise at the input 49 of the band-pass filter 47 is filtered and only a sine wave signal whose frequency is equal to the center frequency of the filter is passed. The zero-crossing detector 48 delivers on its output 51 a square wave whose frequency is $\omega_0$. This square wave is applied to the input 49 of the band-pass filter 47 and this filter 47 generates a sine wave at the fundamental frequency $\omega_0$. The zero-crossing detector 48 introduces a very high gain to guarantee a sustained oscillation. Again, the zero-crossing detector 48 can be connected to the band-pass filter 47 through switching elements 52 and 53 for the duration of the test.

FIG. 9

This figure shows the implementation of the method of FIG. 8 for a second order active band-pass filter which has a center frequency of approximately 25 kHz.

Experimentation of the circuits of FIGS. 8 and 9 have demonstrated that both catastrophic and parametric faults can be detected.

To enable the use of the method of FIGS. 8 and 9, other filter circuits can be converted to a band-pass filter using mathematical transformations as explained earlier for the conversion of a given circuit to an oscillator. Also, the output of a low-pass and high-pass filter may be added together to obtain a band-pass output. The input of a notch filter may be subtracted from its output to construct a band-pass filter. State variable filters can be tested using their band-pass output. It should also be noted that other techniques are available to construct an oscillator from a filter.

Figure 10:
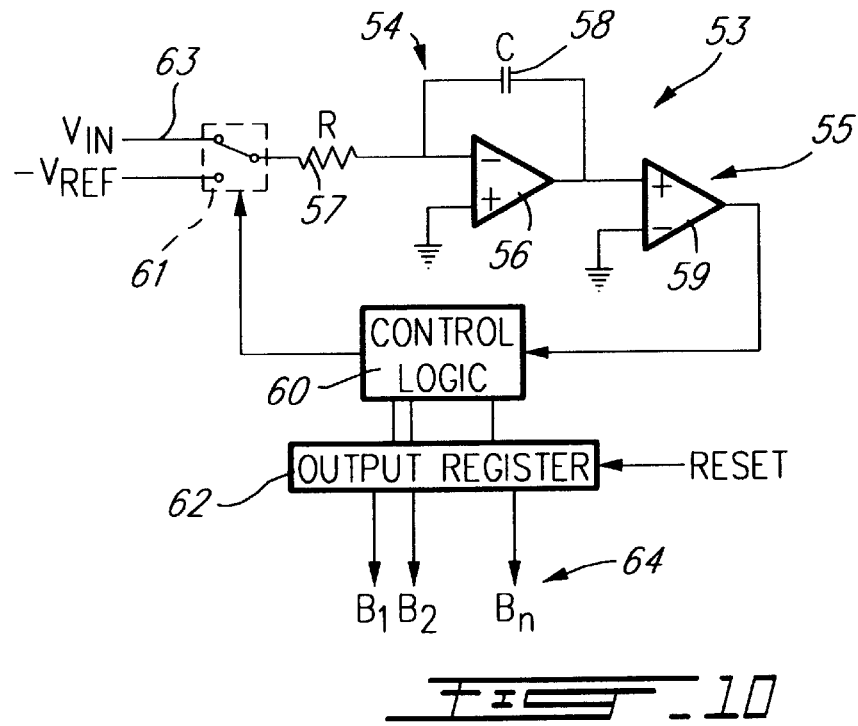
FIG. 10 is a schematic block diagram of a dual-slope analog-to-digital converter.
Figure 11:
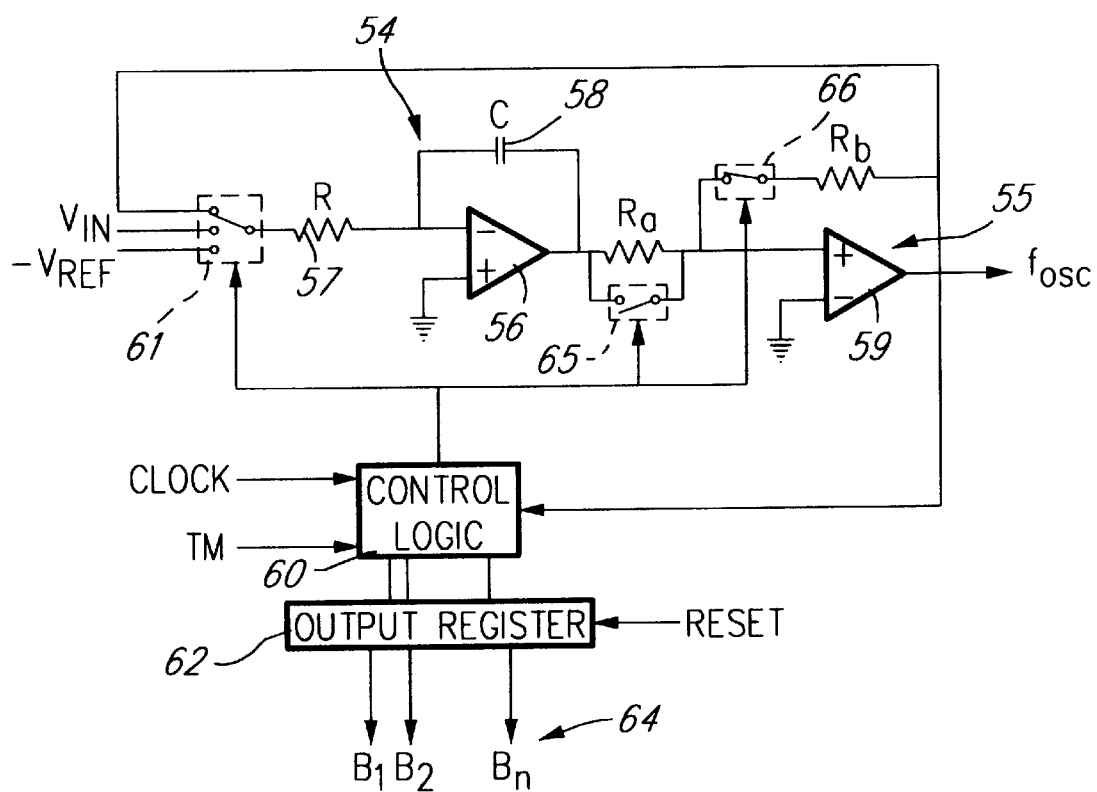
FIG. 11 is a schematic block diagram of an oscillation-based test structure for inserting the analog port of the dual-slope analog-to-digital converter of FIG. 10 into an oscillator circuit.

FIGS. 10 and 11

FIG. 10 illustrates a dual-slope analog-to-digital converter 53. The analog part of the converter 53 comprises an integrator 54 and a comparator 55. The integrator 54 comprises an operational amplifier 56, a resistor 57 having a resistance R, and a capacitor 58 having a capacitance C. The comparator 55 comprises an operational amplifier 59. The property of integrating the input signal 63 by means of the integrator 54 makes the converter 53 immune to noise. The converter 53 further comprises a control logic 60 controlling an input switch 61 through which the input analog signal 63 is supplied to one terminal of the resistor 57, and serving as an interface between the output of the operational amplifier 59 and an output register 62 producing the digital version 64 of the input signal 63. The different components of the analog-to-digital converter 53 are interconnected as shown in FIG. 10. The structure of the analog-to-digital converter 53 is well known to those of ordinary skill in the art and accordingly will not be further described.

FIG. 11 presents a test solution for the analog-to-digital converter of FIG. 10, based on the test method in accordance with the present invention. At the first test phase, the existing integrator 54 and comparator 55 are rearranged to a multivibrator using additional resistors $R_a$ and $R_b$, and switching elements 65 and 66 controllable through the control logic 60. The different components are interconnected as illustrated in FIG. 11. The oscillation frequency and the oscillation condition of the multivibrator circuit of FIG. 11 are respectively given by the following relations:

$$f_{OSC} = \frac{1}{4RC}\left(\frac{R_b}{R_a}\right)$$

and $$R_b > R_a.$$

The above equation assumes that the operational amplifiers are ideal and does not express the effect of the internal characteristics of these operational amplifiers. These effects can be neglected when the operational amplifiers are fault-free, but when there is a fault in the operational amplifiers they influence the oscillation frequency.

The oscillation frequency $f_{OSC}$ is converted to a number by the existing counter (output register 62). The obtained number is compared with the given, nominal number to verify whether there is a fault in the structure of the analog-to-digital converter 53.

At the second test phase, the analog-to-digital converter 53 is rearranged into a functional mode in which a voltage reference $-V_{REF}$ is supplied to the integrator 54 through the switch 61, and converted to digital. The digital number obtained is compared with a second, given test signature number to verify the functionality of the digital part of the analog-to-digital converter 53 and also of value of the signal $-V_{REF}$. The operation is directed by the control logic. All the internal blocks of the analog-to digital converter 53 contribute to the test structure and are therefore tested in a single operation. The simplicity and efficiency of the test architecture of FIG. 11 is obvious. Oversampled analog-to-digital converters have analog components similar to those of FIG. 10; therefore, the same test technique can be applied to them.

The example of FIGS. 10 and 11 proposes an approach which consists of combining different building blocks such as Schmitt triggers, comparators, integrators and amplifiers to construct an oscillator and thereby enable testing in accordance with the resent invention.

Other types of building blocks can also be placed in an oscillator using circuit techniques which are well known to those of ordinary skill in the art of integrated oscillators. Since proposing all the circuit techniques available to convert building blocks to an oscillator is not the main objective of the invention, the present disclosure will be limited to the examples of FIGS. 4a, 4b, and 5–11 which are believed to be sufficient to allow integrated circuit designers to achieve the technique and assure the testability of analog circuits.

Although the present invention has been applied to some specific electronic circuits and some preferred embodiments thereof have been described, it should be understood that many modifications and changes may be made in the illustrated embodiments without departing from the spirit and scope of the invention and that the method is not limited to the presented building blocks.

What is claimed is:

1. An oscillation-based test method for testing an at least partially analog circuit, comprising the steps of:
   (a) dividing said at least partially analog circuit into building blocks each having a given structure;
   (b) connecting to at least one of the building blocks additional circuitry forming with said at least one building block an oscillator circuit producing an output signal, wherein said at least one building block is under test, and wherein the output signal has an oscillation frequency having a frequency value related to the given structure of said at least one building block under test;
   (c) measuring the oscillation frequency of said output signal; and
   (d) detecting a fault in said at least one building block under test when the measured oscillation frequency deviates from a given, nominal frequency.

2. An oscillation-based test method as recited in claim 1, wherein said fault detecting step comprises detecting catastrophic and/or parametric faults in response to a deviation of the measured oscillation frequency from said given, nominal frequency.

3. An oscillation-based test method as recited in claim 1, wherein said measuring step comprises the step of converting the oscillation frequency of said output signal into a frequency representative number.

4. An oscillation-based test method as recited in claim 3, wherein said fault detecting step comprises the steps of:
   comparing the frequency representative number to a given, nominal number; and
   detecting a fault in said at least one building block under test when the frequency representative number deviates from said given, nominal number.

5. An oscillation-based test method as recited in claim 3, wherein said converting step comprises the steps of:
   detecting passages of said output signal by a zero amplitude to produce a square wave clock signal including a series of pulses; and
   counting the pulses of said square wave clock signal to produce the frequency representative number.

6. An oscillation-based test method as recited in claim 1, wherein said connecting step further comprises the step of combining at least two of said building blocks to form said oscillator circuit.

7. An oscillation-based test method as recited in claim 1, wherein said at least partially analog circuit is an integrated circuit, and wherein said oscillation-based test method further comprises the step of integrating said additional circuitry into said integrated circuit.

8. An oscillation-based test method as recited in claim 7, wherein said connecting step comprises the step of connecting said additional circuitry to said at least one building block under test through switching elements, and wherein said oscillation-based test method further comprises the step of opening said switching elements to disconnect said additional circuitry from said at least one building block under test when said fault detecting step is completed.

9. An oscillation-based test method as recited in claim 1, wherein said fault detecting step comprises producing a fail signal when the measured oscillation frequency deviates from said given, nominal frequency, and producing a pass signal when the measured oscillation frequency corresponds to said given, nominal frequency.

10. An oscillation-based test method as recited in claim 1, comprising repeating steps (b), (c) and (d) for testing different building blocks.

11. An oscillation-based test method as recited in claim 1, comprising repeating steps (b), (c) and (d) for testing different groups of said building blocks.

12. A device for testing an at least partially analog circuit divided into building blocks each having a given structure, comprising:

means for connecting to at least one of the building blocks additional circuitry forming with said at least one building block an oscillator circuit producing an output signal, wherein said at least one building block is under test, and wherein the output signal has an oscillation frequency having a frequency value related to the given structure of said at least one building block under test;

means for measuring the oscillation frequency of said output signal; and means for detecting a fault in said at least one building block under test when the measured oscillation frequency deviates from a given, nominal frequency.

13. The device of claim 12, wherein said fault detecting means comprises means for detecting catastrophic and/or parametric faults in response to a deviation of the measured oscillation frequency from said given, nominal frequency.

14. The device of claim 12, wherein said measuring means comprises a frequency-to-number converter for converting the oscillation frequency of said output signal into a frequency representative number, and wherein said fault detecting means comprises a control logic for comparing the frequency representative number to a given, nominal number and for detecting a fault in said at least one building block under test when the frequency representative number deviates from said given, nominal number.

15. The device of claim 14, wherein said frequency-to-number converter comprises a zero crossing detector for detecting passages of said output signal by a zero amplitude to produce a square wave clock signal including a series of pulses, and a counter for counting the pulses of said square wave clock signal to produce the frequency representative number.

16. The device of claim 12, wherein said fault detecting means comprises a control logic for producing a fail signal when the measured oscillation frequency deviates from said given, nominal frequency, and for producing a pass signal when the measured oscillation frequency corresponds to said given, nominal frequency.

17. The device of claim 12, wherein said connecting means comprises means for successively connecting said additional circuitry to different building blocks in order to test said different buildings blocks with the same additional circuitry.

* * * * *